(12) United States Patent
Miller, Jr. et al.

(10) Patent No.: US 9,061,884 B1
(45) Date of Patent: Jun. 23, 2015

(54) INTEGRATED CIRCUIT WITH EFFICIENT MEMS ARCHITECTURE

(75) Inventors: August Joseph Miller, Jr., Chandler, AZ (US); Johnnie Quan, Chandler, AZ (US)

(73) Assignee: Amkor Technology, Inc., Tempe, AZ (US)

( * ) Notice: Subject to any disclaimer, the term of this patent is extended or adjusted under 35 U.S.C. 154(b) by 240 days.

(21) Appl. No.: 13/454,881

(22) Filed: Apr. 24, 2012

(51) Int. Cl.
*H01L 29/84* (2006.01)
*B81B 7/00* (2006.01)

(52) U.S. Cl.
CPC ........... *B81B 7/00* (2013.01); *H01L 2924/1461* (2013.01)

(58) Field of Classification Search
USPC .......................................... 257/416; 381/174
See application file for complete search history.

(56) References Cited

U.S. PATENT DOCUMENTS

| | | | |
|---|---|---|---|
| 6,559,530 B2 | 5/2003 | Hinzel et al. | |
| 6,781,231 B2 | 8/2004 | Minervini | |
| 7,166,910 B2 | 1/2007 | Minervini | |
| 7,242,089 B2 | 7/2007 | Minervini | |
| 7,381,589 B2 | 6/2008 | Minervini | |
| 7,382,048 B2 | 6/2008 | Minervini | |
| 7,434,305 B2 | 10/2008 | Minervini | |
| 7,439,616 B2 | 10/2008 | Minervini | |
| 7,501,703 B2 | 3/2009 | Minervini | |
| 7,537,964 B2 | 5/2009 | Minervini | |
| 8,018,049 B2 | 9/2011 | Minervini | |
| 8,598,698 B1* | 12/2013 | Lim .............................. | 257/698 |
| 2004/0099909 A1 | 5/2004 | Park et al. | |
| 2004/0184632 A1 | 9/2004 | Minervini | |
| 2007/0082421 A1 | 4/2007 | Minervini | |
| 2007/0201715 A1 | 8/2007 | Minervini | |
| 2007/0215962 A1 | 9/2007 | Minervini | |
| 2008/0157238 A1 | 7/2008 | Hsiao | |
| 2009/0057900 A1* | 3/2009 | Lin et al. ........................ | 257/738 |
| 2010/0084752 A1 | 4/2010 | Horning et al. | |
| 2010/0281613 A1 | 11/2010 | Hillenbrand, II | |
| 2011/0108933 A1* | 5/2011 | Nakatani ........................ | 257/415 |
| 2011/0186943 A1* | 8/2011 | Pahl et al. ..................... | 257/416 |

FOREIGN PATENT DOCUMENTS

JP           2010-281613         12/2010

* cited by examiner

*Primary Examiner* — David Vu
*Assistant Examiner* — Brandon Fox
(74) *Attorney, Agent, or Firm* — McAndrews, Held & Malloy (57) ABSTRACT

An electrical circuit having a spatially-efficient MEMS architecture, substantially as shown in and/or described in connection with at least one of the figures, as set forth more completely in the claims.

20 Claims, 4 Drawing Sheets

Figure 6

INTEGRATED CIRCUIT WITH EFFICIENT MEMS ARCHITECTURE

CROSS-REFERENCE TO RELATED APPLICATIONS/INCORPORATION BY REFERENCE

[Not Applicable]

FEDERALLY SPONSORED RESEARCH OR DEVELOPMENT

[Not Applicable]

SEQUENCE LISTING

[Not Applicable]

MICROFICHE/COPYRIGHT REFERENCE

[Not Applicable]

BACKGROUND OF THE INVENTION

Present electrical circuits that include MEMS devices are spatially inefficient. Further limitations and disadvantages of conventional and traditional approaches will become apparent to one of skill in the art, through comparison of such approaches with the present invention as set forth in the remainder of the present application with reference to the drawings.

DETAILED DESCRIPTION OF VARIOUS ASPECTS OF THE INVENTION

The following discussion will present various aspects of the present invention by providing various examples thereof. Such examples are non-limiting, and thus the scope of various aspects of the present invention should not necessarily be limited by any particular characteristics of the provided examples unless explicitly claimed. In the following discussion, the phrases "for example" and "e.g." are non-limiting and is generally synonymous with "by way of example and not limitation", "for example and not limitation", and the like.

Present MicroElectroMechanical System (MEMS) circuits, for example multi-chip architectures, are spatially inefficient. Various aspects of the present invention provide for a spatially efficient architecture.

Figure 1:
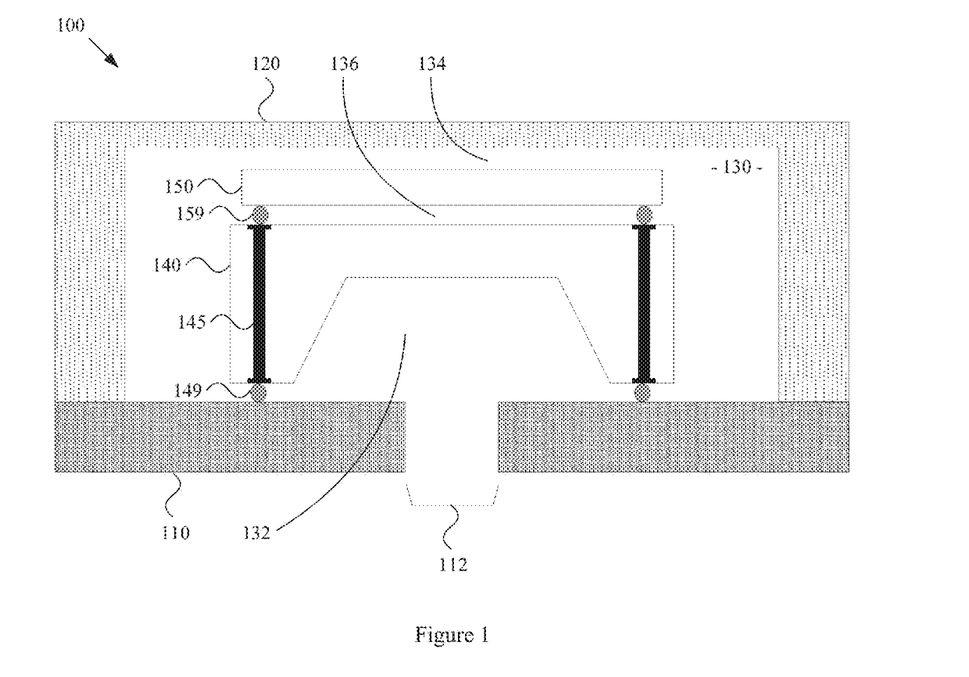
FIG. 1 is a diagram illustrating a side cross-sectional view of an electrical circuit comprising a MEMS device and ported substrate, in accordance with various aspects of the present invention.

Referring first to FIG. 1, such figure is a diagram illustrating a side cross-sectional view of an electrical circuit 100 comprising a MEMS device and ported substrate, in accordance with various aspects of the present invention.

The electrical circuit 100 comprises a substrate 110 (or reference substrate). Such a substrate 110 may comprise characteristics of any of a variety of types of substrates on which MEMS and/or integrated circuit chips may be mounted. The substrate 110 may, for example, be a package substrate, printed circuit board, semiconductor substrate, etc.

The electrical circuit 100 also comprises a cover 120. Such a cover 120 may, for example, be a cavity substrate, cap wafer, metallic lid, plastic cover, ceramic cover, etc. The cover 120 may, for example, be formed from the same material as the substrate 110. For example, the cover 120 may perform an electrical function (e.g., an interconnect function, a shielding function, a signal modification function, a signal processing function, a component-mounting function, etc.). For example, though not illustrated, any or all components discussed herein may be attached to the cover 120 rather than the substrate 110. Additionally, the substrate 110 and/or cover 120 may comprise features for attaching the electrical circuit 100 to a printed circuit board (e.g., substrate 110 attached to PCB, cover 120 attached to PCB, etc.).

The cover 120 and substrate 110 form a cavity 130 in which various components are positioned. As will be discussed below, such components may be electrical components, electrical-mechanical components, semiconductor chips (unpackaged and packaged), any of a variety of active and/or passive electrical components, MEMS devices, etc.

The cover 120 may, for example, be attached to the substrate 110 utilizing any of a variety of attachment techniques. For example, the cover 120 may be attached to the substrate 110 utilizing epoxy, solder, etc.

The electrical circuit 100 comprises a MEMS device 140. The MEMS device 140 may be one of any of a variety of types of MEMS devices. For example, the MEMS device 140 may be a microphone, accelerometer, gyroscope, pressure sensor, display, optical switch, display, micromirror device, Bio-MEMS device, etc.

In the exemplary illustration in FIG. 1, the MEMS device 140 is a microphone MEMS device. The MEMS device 140 is formed to have a MEMS cavity 132. To provide a path for sound energy to the MEMS device 140, the substrate 110 comprises an opening 112 or port. The MEMS device 140 and MEMS cavity 132 are positioned over the opening 112. Though FIG. 1 illustrates only one opening 112 for the electrical circuit 100, other openings may be present, for example in addition to the opening 112 and/or instead of the opening 112. For example, other openings may be present in the substrate 110, cover 120 (including sidewalls), etc. In an exemplary implementation, the MEMS device 140 may be mounted to the cover 120 beneath an opening in the cover 120.

The MEMS device 140 comprises one or more conductive vias 145 extending through the MEMS device 140, for example from top to bottom in the illustration. The conductive via 145 may, for example, comprise any one or more of a through-silicon via (TSV), die-level routing between layers, surface pads, etc. The conductive via 145 may, for example, extend generally straight through the MEMS device 140 (e.g., from top to bottom). Also for example, the conductive via 145 may comprise one or more changes of direction within the MEMS device 140, for example forming a non-linear path through the MEMS device 140.

The conductive via 145 may, for example, provide a conductive path to one or more internal electrical components of the MEMS device 140. In such a configuration, a substrate or electrical component coupled to the conductive via 145 may communicate with one or more components of the MEMS device 140 through the conductive via 145.

The conductive via 145 may alternatively, for example, provide a conductive path from a first side (e.g., a top side) of the MEMS device 140 to a second side (e.g., a bottom side) of the MEMS device 140, where such conductive path is not communicatively coupled to a component (e.g., an electrical component and/or electromechanical component) of the MEMS device 140. In other words, the conductive via 145 might serve only as a conduit for signals (e.g., communication signals, power signals, etc.) passing through the MEMS device 140 and not interacting with any circuitry of the MEMS device 140.

As mentioned above, the MEMS device 140 may have a plurality of such conductive vias 145. Such a plurality of conductive vias 145 may comprise any combination of the different types of vias discussed above and/or types of vias not explicitly discussed herein.

The MEMS device 140 is attached to the substrate 110. Such attachment may be performed in any of a variety of manners (e.g., utilizing conductive epoxy, solder, etc.). As exemplified in the electrical circuit 100 of FIG. 1, the MEMS device 140 may be attached to the substrate 110 using conductive bumps 149 (e.g., solder bumps, gold and copper stud bumps, etc.). For example, the conductive via 145, on the bottom side of the MEMS device 140, may be attached to a corresponding pad on the substrate 110 with a conductive bump 149. Each conductive via 145 of the MEMS device 140 may be attached to the substrate 110 in a similar manner. Also for example, though not illustrated in FIG. 1, the MEMS device 140 may comprise other pads (e.g., not associated with a conductive via 145), which may similarly be attached to the substrate 110 using conductive bumps or some other means. Additionally, though not shown in FIG. 1, the gap between the MEMS device 140 and the substrate 110 may be underfilled.

The electrical circuit 100 comprises an integrated circuit chip (or die) 150. The integrated circuit chip 150 may comprise characteristics of any of a variety of different types of integrated circuit chips, depending on the particular type of MEMS device 140 utilized in the electrical circuit. For example, in a scenario involving a microphone MEMS device 140, the integrated circuit chip 150 may comprise circuitry that processes and communicates sound-related signals with the MEMS device 140. The integrated circuit chip 150 may comprise a single die or a die stack. The integrated circuit chip 150 may, for example, be a flip chip that is bumped for reflow attachment.

The integrated circuit chip 150 is attached to the top side of the MEMS device 140. Such attachment may be performed in any of a variety of manners (e.g., utilizing conductive epoxy, solder, etc.). As exemplified in the electrical circuit 100 of FIG. 1, the integrated circuit chip 150 is a flip chip that is attached to the MEMS device 140 using conductive bumps 159 (e.g., solder bumps, gold and copper stud bumps, etc.). For example, a contact or pad of the integrated circuit chip 150 may be attached to the conductive via 145 on the top side of the MEMS device 140 with a conductive bump 159. Additional pads of the integrated circuit chip 150 may be attached to corresponding conductive vias of the MEMS device 140 in a similar manner. Also for example, though not illustrated in FIG. 1, the integrated circuit chip 150 may comprise other pads (e.g., not associated with a conductive via 145), which may similarly be attached to corresponding pads of the MEMS device 140 using conductive bumps, conductive epoxy, or other means.

The integrated circuit chip 150 may be configured and/or attached to the MEMS device 140 in various manners, depending on the nature of the MEMS device 140 and the integrated circuit chip 150. For example, the integrated circuit chip 150 is generally attached to the MEMS device 140 in a manner that does not interfere with operation of the MEMS device 140. For example, in an exemplary scenario in which the MEMS device 140 is a microphone device that comprises a diaphragm, the points of attachment between the integrated circuit chip 150 and the MEMS device 140 are located on an area of the MEMS device 140 that is outside the perimeter of the diaphragm. Such attachment reduces or eliminates any adverse impact that the attachment of the integrated circuit chip 150 to the MEMS device 140 might have on motion of the diaphragm.

In an exemplary scenario in which the integrated circuit chip 150 is a flip chip and is not originally configured with a pad placement that avoids interference with operation of the MEMS device 140, a redistribution layer may be added to the integrated circuit chip 150 to move the contact pads of the flip chip to respective locations that will not interfere with operation of the MEMS device 140 when the contact pads are attached to the MEMS device 140. For example, in an exemplary scenario in which the integrated circuit chip 150 is originally configured with a pad configuration in which a pad is located at the same location as a diaphragm of the MEMS device 140, a redistribution layer may be utilized to move such a pad outside the perimeter of the diaphragm.

In another exemplary scenario, the integrated circuit chip 150 might be relatively smaller than the MEMS device 140 (e.g., instead of generally the same size, or larger, than the MEMS device 140). In such a scenario, the entire integrated circuit chip 150 may be positioned on the MEMS device 140 away from sensitive areas of the MEMS device 140 that might be adversely impacted by the presence of the integrated circuit chip 150. In such a scenario, conductive vias 145 of the MEMS device 140 may be laid out in accordance with such chip placement. Additionally for example, a plurality of such smaller chips (or passive components) may be likewise attached to the MEMS device 140.

In configurations that might be sensitive to air flow in and around the MEMS device 140, various aspects of the present invention may comprise airflow enhancement features to provide for a desired quality of airflow. For example, in an exemplary configuration in which the integrated circuit chip 150 covers a region of the MEMS device 140 that is sensitive to airflow, an airflow channel may be formed in the MEMS device 140 and/or in the integrated circuit chip 150 to compensate for loss of airflow due to the positioning of the integrated circuit chip 150. Also, as discussed above, various implementations may utilize a redistribution layer to relocate signal pads. In such an implementation, the redistribution layer may also comprise air channel features to provide for increased air flow and/or to direct air flow with a particular region of the MEMS device 140. Additionally, in a scenario in which pad density of the integrated circuit chip 150 is high enough to impede air flow to/from the MEMS device 140, a redistribution layer may be added to the integrate circuit chip to provide regions clear of bumps through which air may freely flow.

In configurations such as those discussed above, in which the integrated circuit chip 150 is attached to the top of the MEMS device 140, there is a gap 136 between the MEMS device 140 and the integrated circuit chip 150. In such configurations, underfill may be utilized between the integrated circuit chip 150 and the MEMS device 140, depending on the nature of the MEMS device 140. For example, in a configuration (e.g., a MEMS microphone configuration) in which airflow and/or an air chamber is preferred or necessary, underfill might not be utilized at all or might only be utilized at two or three ends of the integrated circuit chip 150, leaving a channel for free airflow near the center of the integrated circuit chip 150 or creating an air pocket at such location. For example, underfill might be utilized between the integrated circuit chip 150 and the MEMS device 140, but not filling the entire gap between such components. In another example, for example in which the upper side of the MEMS device 140 is not sensitive to mechanical interference, underfill may be utilized to fill the entire gap between the integrated circuit chip 150 and the MEMS device 140.

In another exemplary implementation, the integrated circuit chip 150 may comprise at least one conductive layer. Thus, the integrated circuit chip 150 may help shield the MEMS device 140 and/or various portions of the integrated circuit chip 150 from electromagnetic interference (EMI). For example, one or more of the conductive vias 145 through the MEMS device 140 to which the integrated circuit chip 150 is attached may provide a ground signal or other reference. Such connectivity to ground may then pass through the conductive via 145 to the at least one conductive layer to provide for EMI shielding.

As discussed previously, the electrical circuit 100 comprises a cover 120. In various configurations, the cover 120 may be positioned over (e.g., on top of) at least the integrated circuit chip 150. In such configurations, the space between the integrated circuit chip 150 and the cover 120 may be free of electrical components and wirebonds, leaving a relatively narrow gap 134. Also in such configurations, the gap 134 may be filled with a thermal interface material to enhance the transfer of heat from the integrated circuit chip 150 to the cover 120.

The previous discussion generally focused on the attachment of an integrated circuit chip 150 to the top of the MEMS device 140. Such configuration is merely illustrative and non-limiting. For example, any of a number of electrical devices may be attached to the top of the MEMS device 140 (e.g., to an end of a conductive via 145 of the MEMS device 140). For example, any of a variety of active and/or passive electrical components may be attached to the top side of the MEMS device 140 and, for example, attached to a top end of a conductive via 145 extending through the MEMS device 140.

Figure 2:
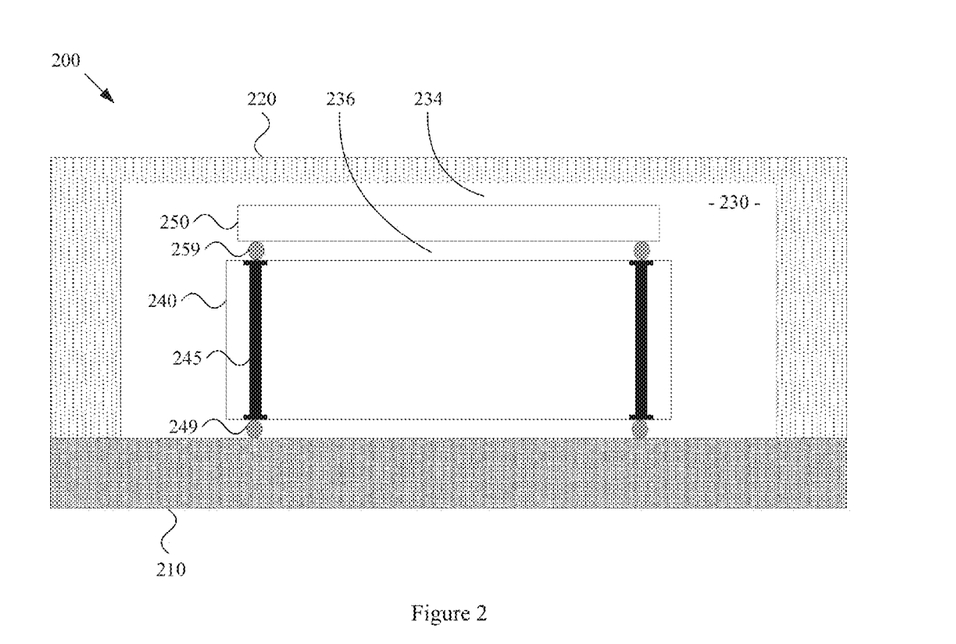
FIG. 2 is a diagram illustrating a side cross-sectional view of an electrical circuit comprising a MEMS device and non-ported substrate, in accordance with various aspects of the present invention.

FIG. 1 shows a type of MEMS device (e.g., a microphone MEMS device) that utilizes a port 112 in the substrate 110. As discussed above, the MEMS device 140 may be one of any of a variety of types of MEMS device. FIG. 2 provides an exemplary configuration with a MEMS device that does not utilize a port in the substrate.

Turning to FIG. 2, such figure is a diagram illustrating a side cross-sectional view of an electrical circuit 200 comprising a MEMS device and non-ported substrate, in accordance with various aspects of the present invention. Except where highlighted below, the electrical circuit 200 may, for example, share any or all characteristics with the electrical circuit 100 illustrated in FIG. 1 and discussed previously.

The electrical circuit 200 comprises a MEMS device 240. The MEMS device 240 may generally share any or all characteristics with the MEMS device 140 of FIG. 1, discussed previously. For example, the MEMS device 240 may be an accelerometer, gyroscope, etc. The MEMS device 240 may, for example, be a type of MEMS device that does not require a port in a substrate to which it is attached.

The electrical circuit 200 comprises a substrate 210 (or reference substrate). The substrate 210 may generally share any or all characteristics with the substrate 110 of FIG. 1, discussed previously. Unlike the substrate 110 of FIG. 1, the substrate 210 (e.g., adjacent to the MEMS device 240 and/or elsewhere) might not comprise a hole or port through the substrate 210). For example, depending on the architecture of the MEMS device 240, such a hole may be unnecessary and/or undesirable. Alternatively, a port may be formed elsewhere in the circuit 200 (e.g., in the cover 220, in a sidewall, etc.).

As with the MEMS device 140 discussed previously with respect to FIG. 1, the MEMS device 240 comprises one or more conductive vias 245 extending through the MEMS device 240, for example from top to bottom in the illustration. Such conductive via(s) 245 may share any or all characteristics with the conductive via(s) 145 discussed previously with regard to FIG. 1.

The MEMS device 240 is attached to the substrate 210. Such attachment may be performed in any of a variety of manners (e.g., utilizing conductive epoxy, solder, etc.). For example, as discussed previously with regard to FIG. 1, the MEMS device 240 may be attached to the substrate 210 using conductive bumps 249 (e.g., solder bumps, gold and copper stud bumps, etc.). For example, the conductive via 245, on the bottom side of the MEMS device 240, may be attached to a corresponding pad on the substrate 210 with a conductive bump 249. Each conductive via 245 of the MEMS device 240 may be attached to the substrate 210 in a similar manner. Also for example, though not illustrated in FIG. 2, the MEMS device 240 may comprise other pads (e.g., pads not associated with a conductive via 245), which may similarly be attached to the substrate 210 using conductive bumps, conductive epoxy, or other means. Additionally, though not shown in FIG. 2, the gap between the MEMS device 240 and the substrate 210 may be underfilled.

The electrical circuit 200 comprises an integrated circuit chip (or die) 250. The integrated circuit chip 250 may, for example, share any or all characteristics with the integrated circuit chip 150 discussed previously with regard to FIG. 1. The integrated circuit chip 250 may comprise characteristics of any of a variety of different types of integrated circuit chips, depending on the particular type of MEMS device 240 utilized in the electrical circuit 200. For example, in a scenario involving an accelerometer MEMS device 240, the integrated circuit chip 250 may comprise circuitry that processes and communicates acceleration-related signals with the MEMS device 240. Also for example, in a scenario involving a gyroscope MEMS device 240, the integrated circuit chip 250 may comprise circuitry that processes and communicates orientation-related signals with the MEMS device 240. The integrated circuit chip 250 may comprise a single die or a die stack. The integrated circuit chip 250 may, for example, be a flip chip that is bumped for reflow attachment.

The integrated circuit chip 250 is attached to the top side of the MEMS device 240. Such attachment may share any or all characteristics with the attachment of the integrated circuit chip 150 to the top side of the MEMS device 140 discussed previously with regard to FIG. 1. Such attachment may for example, be performed in any of a variety of manners (e.g., utilizing conductive epoxy, solder, etc.). As exemplified in the electrical circuit 200 of FIG. 2, the integrated circuit chip 250 is a flip chip that is attached to the MEMS device 240 using conductive bumps 259 (e.g., solder bumps, gold and copper stud bumps, etc.). For example, a contact or pad of the integrated circuit chip 250 may be attached to the conductive via 245 on the top side of the MEMS device 240 with a conductive bump 259. Additional pads of the integrated circuit chip 250 may be attached to corresponding conductive vias of the MEMS device 240 in a similar manner. Also for example, though not illustrated in FIG. 2, the integrated circuit chip 250 may comprise other pads (e.g., not associated with a conductive via 245), which may similarly be attached to corresponding pads of the MEMS device 240 using conductive bumps, conductive epoxy, or other means.

As discussed previously with regard to FIG. 1, the integrated circuit chip 250 may be configured and/or attached to the MEMS device 240 in various manners, depending on the nature of the MEMS device 240 and the integrated circuit chip 250. For example, the integrated circuit chip 250 is generally attached to the MEMS device 240 in a manner that does not interfere with operation of the MEMS device 240. For example, in an exemplary scenario in which the MEMS device 240 is an accelerometer that comprises a moving component for acceleration determination, the integrated circuit chip 250 is attached to the MEMS device 240 such that the integrated circuit chip 250, including the points of attachment between the integrated circuit chip and the MEMS device, is outside the range of motion of the moving component. Such attachment reduces or eliminates any adverse impact that the attachment of the integrated circuit chip 250 to the MEMS device 240 might have on motion of the moving component.

In an exemplary scenario in which the integrated circuit chip 250 is a flip chip and is not originally configured with a pad placement that avoids interference with operation of the MEMS device 150, a redistribution layer may be added to the integrated circuit chip 250 to move the contact pads of the flip chip to respective locations that will not interfere with operation of the MEMS device 240 when the contact pads are attached to the MEMS device 240. For example, in an exemplary scenario in which the integrated circuit chip 250 is originally configured with a pad configuration in which a pad is located within the range of motion of a moving component of the MEMS device 240, a redistribution layer may be utilized to move such a pad outside the range of motion of the moving component.

As discussed previously with regard to FIG. 1, the integrated circuit chip 250 may be of any of a variety of sizes, and a plurality of such chips and/or passive components may be mounted to the MEMS device 240. Additionally for example, the MEMS device 240 and/or integrated circuit chip 250 (including a redistribution layer), may comprise airflow enhancement features. Further for example, the integrated circuit chip 250 may comprise one or more conductive layers that are utilized for electromagnetic shielding (e.g., of the MEMS device 240 and/or circuitry of the integrated circuit chip 250 beneath such conductive layer(s)).

Further for example, in configurations in which the integrated circuit chip 250 is attached to the top of the MEMS device 240, there is a gap 236 between the MEMS device 240 and the integrated circuit chip 250, where such gap may be filled with underfill. For example, in a configuration in which empty space between the MEMS device 240 and the integrated circuit chip 250 is unnecessary, the entire gap between the MEMS device 240 and the integrated circuit chip 250 may be underfilled. Such underfill may be structurally beneficial for applications involving relatively large accelerations and/or other environmental extremes.

Lastly, the electrical circuit 200 comprises a cover 220. In various configurations, the cover 220 may be positioned over (e.g., on top of) at least the integrated circuit chip 250. In such configurations, the space between the integrated circuit chip 250 and the cover 220 may be free of electrical components and wirebonds, leaving a relatively narrow gap 234. Also in such configurations, the gap 234 may be filled with a thermal interface material to enhance the transfer of heat from the integrated circuit chip 250 to the cover 220.

The previous discussions of FIGS. 1 and 2 presented various aspects of the present invention in an electrical circuit configuration in which an integrated circuit chip is mounted to the top of a MEMS device and communicatively coupled to a substrate beneath the MEMS device through vias provided in the MEMS device. Various aspects of the present invention may also be utilized in a side-by-side configuration in which a MEMS device and an integrated circuit chip in communication with the MEMS device are both attached to the substrate. Such aspects will now be presented by way of non-limiting example by referring to FIGS. 3-6.

Figure 3:
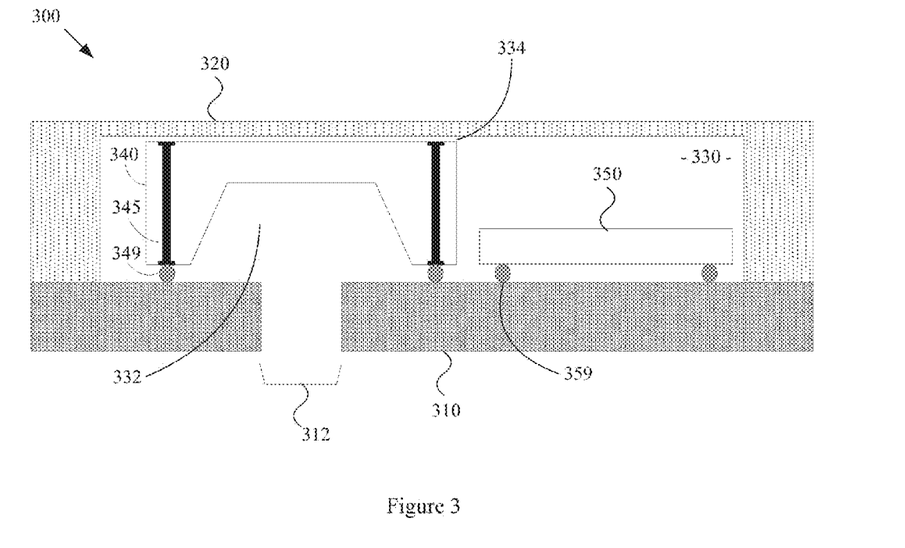
FIG. 3 is a diagram illustrating a side cross-sectional view of an electrical circuit comprising a MEMS device and ported substrate, in accordance with various aspects of the present invention.

FIG. 3 is a diagram illustrating a side cross-sectional view of an electrical circuit 300 comprising a MEMS device and ported substrate, in accordance with various aspects of the present invention. Except where otherwise noted below, the electrical circuit 300 may share any or all characteristics with the electrical circuits 100, 200 illustrated in FIGS. 1-2 and discussed previously. In general, the electrical circuit 300 differs from the electrical circuit 100 of FIG. 1 in that the integrated circuit chip 350 is attached to the substrate 310 instead of being attached to the MEMS device 340.

The electrical circuit 300 comprises a substrate (or reference substrate) 310. Such a substrate 310 may, for example, share any or all characteristics with the substrate 110 of FIG. 1, discussed previously. The substrate 310 may, for example, be larger than the substrate 110 of FIG. 1, the substrate 310 comprising additional attachment area for attachment of the integrated circuit chip 350. The substrate 310 comprises a hole 312 (or port), for example to provide for environmental communication (e.g., air flow, pressure flow, fluid flow, etc.) through the substrate 310.

The electrical circuit 300 also comprises a cover 320. Such a cover 320 may, for example, share any or all characteristics with the cover 120 of FIG. 1, discussed previously. The cover 320 may, for example, be wider than the cover 120 of FIG. 1, where the cover 320 comprises additional coverage area for coverage of the integrated circuit chip 350. The cover 320 (e.g., including integrated sidewalls or independent sidewall spacers thereof) may also be shorter than the cover 120 of FIG. 1, where the cover 120 of FIG. 1 may comprise additional height to accommodate the integrated circuit chip 150 on top of the MEMS device 140.

The electrical circuit 300 comprises a MEMS device 340. The MEMS device 340 may, for example, share any or all characteristics with the MEMS device 140 of FIG. 1, discussed previously. For example, the MEMS device 340 is formed to have a MEMS cavity 332 that is positioned above the port 312 of the substrate 310 when the MEMS device 340 is attached to the substrate 310. Also for example, the MEMS device 340 may comprise one or more conductive vias 345 extending therethrough. Additionally for example, the MEMS device 340 may be attached to the substrate 310 using conductive bumps 349 (e.g., solder bumps, gold and copper stud bumps, etc.), at least a portion of which may be attached to conductive vias 345 of the MEMS device 340. For example, the conductive via 345, on the bottom side of the MEMS device 340, may be attached to a corresponding pad on the substrate 310 with a conductive bump 349.

The electrical circuit 300 comprises an integrated circuit chip (or die) 350. The integrated circuit chip 350 may share any or all characteristics with the integrated circuit chip 150 of FIG. 1, discussed previously. For example, in a scenario involving a microphone MEMS device 340, the integrated circuit chip 350 may comprise circuitry that processes and communicates sound-related signals with the MEMS device 340.

The integrated circuit chip 350 is attached to the substrate 310. Such attachment is different from the attachment of the integrated circuit chip 150 to the top side of the MEMS device 140, as illustrated in FIG. 1 and discussed previously. Such attachment may be performed in any of a variety of manners (e.g., utilizing conductive epoxy, solder, etc.). As exemplified in the electrical circuit 300 of FIG. 3, the integrated circuit chip 350 is a flip chip that is attached to the substrate 310 using conductive bumps 359 (e.g., solder bumps, gold and copper stud bumps, etc.). For example, a contact or pad of the integrated circuit chip 350 may be attached to a corresponding pad on the substrate 310 with a conductive bump 359. Traces on or in the substrate 310 may then be utilized to communicate signals between the integrated circuit chip 350 and the MEMS device 340. Though not shown in FIG. 3, underfill may be injected in the gap between the integrated circuit chip 350 and the substrate 310.

The electrical circuit 300 comprises a cover 320. In various configurations, the cover 320 may be positioned over (e.g., on top of) at least the MEMS device 340 and the integrated circuit chip 350. As opposed to the electrical circuit 100 illustrated in FIG. 1 which showed the integrated circuit chip 150 between the MEMS device 140 and the cover 120, the electrical circuit 300 has only at most a gap between the MEMS device 340 and the cover 320. In such a configuration, the space between the MEMS device 340 and the cover 320 may be free of electrical components and wirebonds, leaving a relatively narrow gap 334. Also in such a configuration, the gap 334 may be filled with a thermal interface material to enhance the transfer of heat from the MEMS device 340 to the cover 320. Though not shown in FIG. 3, in a scenario in which heat transfer is desired between the integrated circuit chip 350 and the cover 320 and the gap between the integrated circuit chip 350 and the cover 320 is too large for utilization of conventional thermal interface material, a silicon spacer, custom cover feature, or other heat transfer structure may be utilized to provide a heat-conductive path between the integrated circuit chip 350 and the cover 320.

The above discussion generally focused on the attachment of an integrated circuit chip 350 to the substrate 310 in addition to the MEMS device 340. Such configuration is merely illustrative and non-limiting. For example, any of a number of electrical devices may be attached to the substrate 310. For example, any of a variety of active and/or passive electrical components may be attached to the substrate 310 in addition to, or instead of, the integrated circuit chip 350.

Figure 4:
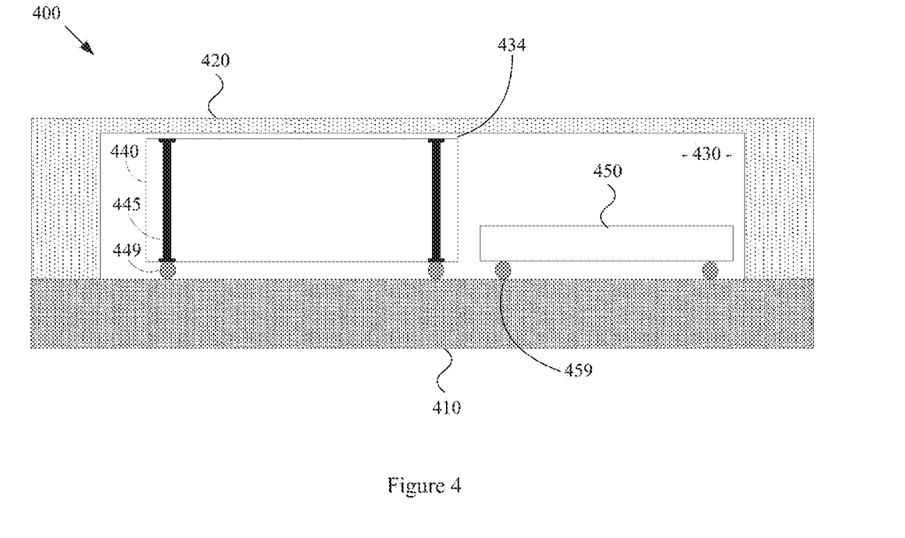
FIG. 4 is a diagram illustrating a side cross-sectional view of an electrical circuit comprising a MEMS device and non-ported substrate, in accordance with various aspects of the present invention.

FIG. 3 shows a type of MEMS device (e.g., a microphone MEMS device) that utilizes a port 312 in the substrate 310. As discussed above, the MEMS device 340 may be one of any of a variety of types of MEMS device. FIG. 4 provides an exemplary configuration with a MEMS device that does not utilize a port in the substrate.

Turning to FIG. 4, such figure is a diagram illustrating a side cross-sectional view of an electrical circuit 400 comprising a MEMS device and non-ported substrate, in accordance with various aspects of the present invention. Except where highlighted below, the electrical circuit 400 may, for example, share any or all characteristics with the electrical circuit 200 of FIG. 2, discussed previously. Except where otherwise noted below, the electrical circuit 400 may share any or all characteristics with the electrical circuits 100, 200, 300 illustrated in FIGS. 1-3 and discussed previously. In general, the electrical circuit 400 differs from the electrical circuit 200 of FIG. 2 in that the integrated circuit chip 450 is attached to the substrate 410 instead of being attached to the MEMS device 440.

The electrical circuit 400 comprises a substrate (or reference substrate) 410. Such a substrate 410 may, for example, share any or all characteristics with the substrate 210 of FIG. 2, discussed previously. The substrate 410 may, for example, be larger than the substrate 210 of FIG. 2, the substrate 410 comprising additional attachment area for attachment of the integrated circuit chip 450. Unlike the substrate 310 of FIG. 3, the substrate 410 (e.g., adjacent to the MEMS device 440 and/or elsewhere) might not comprise a hole or port). For example, depending on the architecture of the MEMS device 440, such a hole may be unnecessary and/or undesirable. Alternatively, a port may be formed elsewhere in the circuit 400 (e.g., in the cover 420, sidewall, etc.).

The electrical circuit 400 also comprises a cover 420. Such a cover 420 may, for example, share any or all characteristics with the cover 220 of FIG. 2, discussed previously. The cover 420 may, for example, be wider than the cover 220 of FIG. 2, where the cover 420 comprises additional coverage area for coverage of the integrated circuit chip 450. The cover 420 (e.g., including integrated sidewalls or independent sidewall spacers thereof) may also be shorter than the cover 220 of FIG. 2, where the cover 220 of FIG. 2 may comprise additional height to accommodate the integrated circuit chip 250 on top of the MEMS device 240.

The electrical circuit 400 comprises a MEMS device 440. The MEMS device 440 may, for example, share any or all characteristics with the MEMS device 240 of FIG. 2, discussed previously. For example, the MEMS device 440 may comprise one or more conductive vias 445 extending therethrough. Additionally for example, the MEMS device 440 may be attached to the substrate 410 using conductive bumps 449 (e.g., solder bumps, gold and copper stud bumps, etc.), at least a portion of which may be attached to conductive vias 445 of the MEMS device 440. For example, the conductive via 445, on the bottom side of the MEMS device 440, may be attached to a corresponding pad on the substrate 410 with a conductive bump 449.

The electrical circuit 400 comprises an integrated circuit chip (or die) 450. The integrated circuit chip 450 may share any or all characteristics with the integrated circuit chip 250 of FIG. 2, discussed previously. For example, in a scenario involving an accelerometer MEMS device 440, the integrated circuit chip 450 may comprise circuitry that processes and communicates acceleration-related signals with the MEMS device 440. Also for example, in a scenario involving a gyroscope MEMS device 440, the integrated circuit chip 450 may comprise circuitry that processes and communicates orientation-related signals with the MEMS device 440. The integrated circuit chip 450 may comprise a single die or a die stack.

The integrated circuit chip 450 is attached to the substrate 410. Such attachment is different from the attachment of the integrated circuit chip 250 to the top side of the MEMS device 240, as illustrated in FIG. 2 and discussed previously. Such attachment may be performed in any of a variety of manners (e.g., utilizing conductive epoxy, solder, etc.). As exemplified in the electrical circuit 400 of FIG. 4, the integrated circuit chip 450 is a flip chip that is attached to the substrate 410 using conductive bumps 459 (e.g., solder bumps, gold and copper stud bumps, etc.). For example, a contact or pad of the integrated circuit chip 450 may be attached to a corresponding pad on the substrate 410 with a conductive bump 459. Traces on or in the substrate 410 may then be utilized to communicate signals between the integrated circuit chip 450 and the MEMS device 440. Though not shown in FIG. 4, underfill may be injected in the gap between the integrated circuit chip 450 and the substrate 410.

The electrical circuit 400 comprises a cover 420. In various configurations, the cover 420 may be positioned over (e.g., on top of) at least the MEMS device 440 and the integrated circuit chip 450. As opposed to the electrical circuit 200 illustrated in FIG. 2 which showed the integrated circuit chip 250 between the MEMS device 240 and the cover 220, the electrical circuit 400 has only at most a gap between the MEMS device 440 and the cover 420. In such a configuration, the space between the MEMS device 440 and the cover 420 may be free of electrical components and wirebonds, leaving a relatively narrow gap 434. Also in such a configuration, the gap 434 may be filled with a thermal interface material to enhance the transfer of heat from the MEMS device 440 to the cover 420. Though not shown in FIG. 4, in a scenario in which heat transfer is desired between the integrated circuit chip 450 and the cover 420 and the gap between the integrated circuit chip 450 and the cover 420 is too large for utilization of conventional thermal interface material, a silicon spacer, custom cover feature, or other heat transfer structure may be utilized to provide a heat-conductive path between the integrated circuit chip 450 and the cover 420.

The above discussion generally focused on the attachment of an integrated circuit chip 450 to the substrate 410 in addition to the MEMS device 440. Such configuration is merely illustrative and non-limiting. For example, any of a number of electrical devices may be attached to the substrate 410. For example, any of a variety of active and/or passive electrical components may be attached to the substrate 410 in addition to, or instead of, the integrated circuit chip 450.

FIGS. 3 and 4 generally show exemplary circuit implementations in which the integrated circuit chips 350, 450 are flip chips attached to the respective substrates 310, 410. In accordance with various alternative aspects of the present invention, such integrated circuit chips may be coupled to substrates utilizing wirebonding technology. Examples of such implementations are illustrated by FIGS. 5 and 6.

Figure 5:
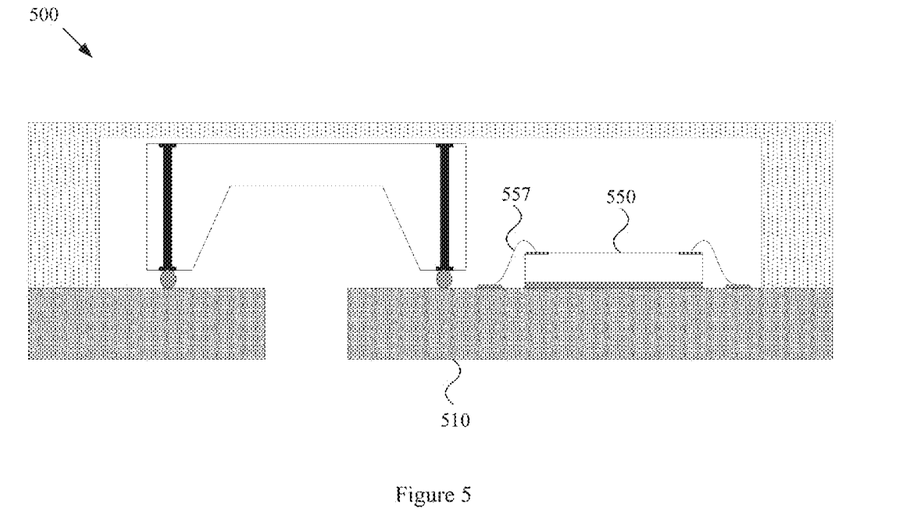
FIG. 5 is a diagram illustrating a side cross-sectional view of an electrical circuit comprising a MEMS device and ported substrate, in accordance with various aspects of the present invention.

Turning next to FIG. 5, such figure is a diagram illustrating a side cross-sectional view of an electrical circuit 500 comprising a MEMS device and ported substrate, in accordance with various aspects of the present invention. Except where otherwise noted below, the electrical circuit 500 may, for example, share any or all characteristics with the electrical circuits 100, 200, 300, 400 illustrated in FIGS. 1-4 and discussed previously. In general, the electrical circuit 500 differs from the electrical circuit 300 of FIG. 3 in that the integrated circuit chip 550 is attached to the substrate 510 utilizing wirebonding technology instead of flip chip technology. For example, the integrated circuit chip 550 is communicatively coupled to the substrate 510 utilizing one or more wirebonds 557.

Figure 6:
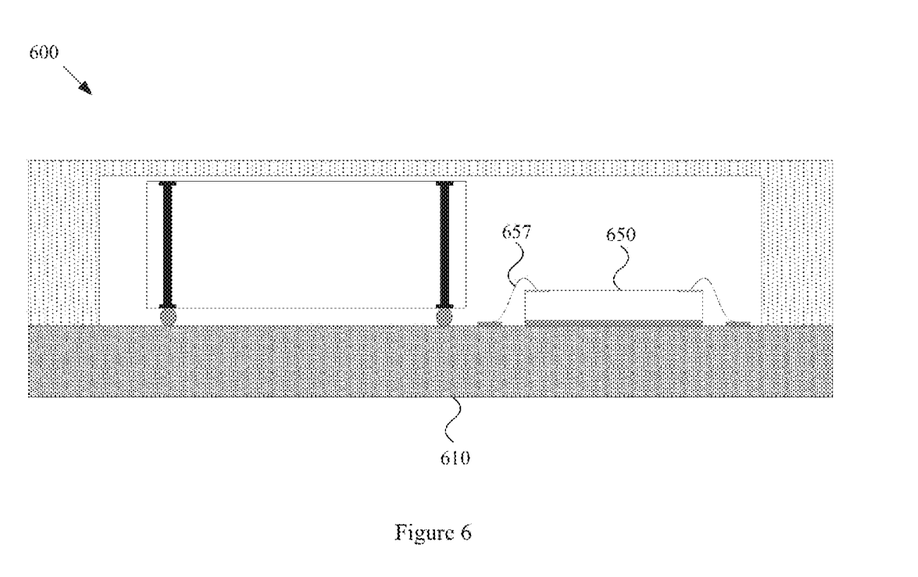
FIG. 6 is a diagram illustrating a side cross-sectional view of an electrical circuit comprising a MEMS device and non-ported substrate, in accordance with various aspects of the present invention.

Turning next to FIG. 6, such figure is a diagram illustrating a side cross-sectional view of an electrical circuit 600 comprising a MEMS device and non-ported substrate, in accordance with various aspects of the present invention. Except where otherwise noted below, the electrical circuit 600 may, for example, share any or all characteristics with the electrical circuits 100, 200, 300, 400, 500 illustrated in FIGS. 1-5 and discussed previously. In general, the electrical circuit 600 differs from the electrical circuit 400 of FIG. 4 in that the integrated circuit chip 650 is attached to the substrate 610 utilizing wirebonding technology instead of flip chip technology. For example, the integrated circuit chip 650 is communicatively coupled to the substrate 610 utilizing one or more wirebonds 657.

In summary, various aspects of the present invention provide an electrical circuit having a spatially-efficient MEMS architecture. While the invention has been described with reference to certain aspects and embodiments, it will be understood by those skilled in the art that various changes may be made and equivalents may be substituted without departing from the scope of the invention. In addition, many modifications may be made to adapt a particular situation or material to the teachings of the invention without departing from its scope. Therefore, it is intended that the invention not be limited to the particular embodiment(s) disclosed, but that the invention will include all embodiments falling within the scope of the appended claims.

What is claimed is:

1. An electrical circuit comprising:
    a substrate comprising an opening that extends through the substrate;
    a MEMS device, wherein:
        the MEMS device comprises a first side at which the MEMS device is attached to the substrate, the first side comprising a cavity that is positioned over the opening in the substrate;
        the MEMS device comprises a second side opposite the first side, the second side being generally planar;
        the MEMS device comprises a conductive via extending through the MEMS device between the first side and the second side; and
        a first end of the conductive via at the first side of the MEMS device is attached to the substrate; and
    passive components positioned at the second side of the MEMS device;
    an integrated circuit chip positioned at the second side of the MEMS device and attached to a second end of the conductive via at the second side of the MEMS device.

2. The electrical circuit of claim 1, wherein the integrated circuit chip is attached to the MEMS device over a diaphragm of the MEMS device utilizing flip chip technology, and further comprises underfill between the integrated circuit chip and the MEMS device.

3. The electrical circuit of claim 2, comprising at least one airflow channel through the underfill between the integrated circuit chip and the MEMS device.

4. The electrical circuit of claim 1, wherein the MEMS device comprises a second conductive via extending through the MEMS device between the first side and the second side, wherein the second conductive via provides a signal path between the integrated circuit chip and the substrate and between the integrated circuit chip and an electrical component of the MEMS device.

5. The electrical circuit of claim 1, wherein the MEMS device is a microphone device.

6. The electrical circuit of claim 5, wherein the MEMS device comprises a diaphragm at the second side, and wherein the integrated circuit chip is attached to the MEMS device at the second side utilizing flip chip technology where all points of attachment between the integrated circuit chip and the MEMS device are outside a perimeter of the diaphragm.

7. The electrical circuit of claim 1, wherein the integrated circuit chip is attached to the MEMS device utilizing flip chip technology and comprises a redistribution layer that positions contact pads of the integrated circuit to respective locations that will not interfere with operation of the MEMS device when the contact pads are attached to the MEMS device.

8. The electrical circuit of claim 1, comprising an air flow channel in the MEMS device that enhances air flow between the integrated circuit chip and the MEMS device.

9. The electrical circuit of claim 7, comprising an air flow channel in the redistribution layer that enhances air flow between the integrated circuit chip and the MEMS device.

10. The electrical circuit of claim 1, further comprising a cover positioned over at least the integrated circuit chip on a side of the integrated circuit chip opposite the MEMS device, and wherein the space between the integrated circuit chip and the cover comprises thermal interface material.

11. An electrical circuit comprising:
a substrate;
a MEMS device, wherein:
the MEMS device comprises a first side at which the MEMS device is attached to the substrate and a second side opposite the first side;
the MEMS device comprises a conductive via extending through the MEMS device between the first side and the second side; and
a first end of the conductive via at the first side of the MEMS device is attached to the substrate;
an integrated circuit chip positioned at the second side of the MEMS device and attached to a second end of the conductive via at the second side of the MEMS device, wherein the integrated circuit chip comprises a redistribution layer that positions contact pads of the integrated circuit chip to respective locations that will not interfere with operation of the MEMS device when the contact pads are attached to the MEMS device; and
a passive component positioned at the second side of the MEMS device.

12. The electrical circuit of claim 11, comprising an air flow channel that enhances air flow between the integrated circuit chip and the MEMS device.

13. The electrical circuit of claim 12, wherein the MEMS device comprises a second conductive via extending through the MEMS device between the first side and the second side, wherein the second conductive via provides a signal path between the integrated circuit chip and the substrate and between the integrated circuit chip and an electrical component of the MEMS device.

14. The electrical circuit of claim 11, further comprising a cover positioned over at least the integrated circuit chip on a side of the integrated circuit chip opposite the MEMS device, and wherein the space between the integrated circuit chip and the cover comprises thermal interface material.

15. The electrical circuit of claim 11, wherein the integrated circuit chip is attached to the MEMS device over a diaphragm of the MEMS device utilizing flip chip technology, and further comprising underfill between the integrated circuit chip and the MEMS device.

16. An electrical circuit comprising:
a substrate;
a MEMS device, wherein:
the MEMS device comprises a first side at which the MEMS device is attached to the substrate and a second side opposite the first side;
the MEMS device comprises a conductive via extending through the MEMS device between the first side and the second side; and
a first end of the conductive via at the first side of the MEMS device is attached to the substrate;
an integrated circuit chip attached to the substrate and communicatively coupled to the MEMS device;
a passive component positioned at the second side of the MEMS device; and
a cover positioned over at least the second side of the MEMS device, wherein the space between the second side of the MEMS device and the cover is free of wire bonds.

17. The electrical circuit of claim 16, further comprising thermal interface material between the integrated circuit chip and the cover.

18. The electrical circuit of claim 16, wherein the MEMS device is a microphone device.

19. The electrical circuit of claim 16, wherein:
the first side of the MEMS device is the passive side;
the second side of the MEMS device is the active side; and
the substrate comprises a port over which the first side of the MEMS device is positioned.

20. An electrical circuit comprising:
a substrate comprising an opening that extends through the substrate;
a MEMS device, wherein:
the MEMS device comprises a first side at which the MEMS device is attached to the substrate, the first side comprising a cavity that is positioned over the opening in the substrate;
the MEMS device comprises a second side opposite the first side, the second side being generally planar;
the MEMS device comprises a conductive via extending through the MEMS device between the first side and the second side;
the MEMS device comprises an air flow channel in the redistribution layer that enhances air flow between the integrated circuit chip and the MEMS device; and
a first end of the conductive via at the first side of the MEMS device is attached to the substrate; and
an integrated circuit chip positioned at the second side of the MEMS device and attached to a second end of the conductive via at the second side of the MEMS device, wherein the integrated circuit chip is attached to the MEMS device utilizing flip chip technology and comprises a redistribution layer that positions contact pads of the integrated circuit to respective locations that will not interfere with operation of the MEMS device when the contact pads are attached to the MEMS device.

* * * * *